(12) United States Patent
Nishiki et al.

(10) Patent No.: US 7,538,853 B2
(45) Date of Patent: May 26, 2009

(54) EXPOSURE PROCESS AND APPARATUS USING GLASS PHOTOMASKS

(75) Inventors: Masashi Nishiki, Miyazaki (JP); Hisashi Okada, Miyakonojo (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 487 days.

(21) Appl. No.: 11/384,317

(22) Filed: Mar. 21, 2006

(65) Prior Publication Data

US 2006/0215146 A1 Sep. 28, 2006

(30) Foreign Application Priority Data

Mar. 25, 2005 (JP) ............................. 2005-087588

(51) Int. Cl.
G03B 27/68 (2006.01)
G03B 27/44 (2006.01)
G03B 27/42 (2006.01)
G03B 27/58 (2006.01)
G03B 27/62 (2006.01)
G03B 27/32 (2006.01)
H01L 21/00 (2006.01)
G03C 5/00 (2006.01)

(52) U.S. Cl. ........................... 355/52; 355/46; 355/53; 355/72; 355/75; 355/77; 430/311; 430/394

(58) Field of Classification Search ................ 355/46, 355/52, 53, 70, 72, 75, 77; 430/5, 22, 311, 430/394
See application file for complete search history.

(56) References Cited

U.S. PATENT DOCUMENTS 5,482,819 A * 1/1996 Tjhia et al. ................. 430/394
6,611,316 B2 * 8/2003 Sewell ........................ 355/46

FOREIGN PATENT DOCUMENTS

| JP | 60-035516 | * | 2/1985 |
| JP | 60-107835 | * | 6/1985 |
| JP | 4-109223 | | 4/1992 |

OTHER PUBLICATIONS

Abstract of JP 60-107835 (dated Jun. 13, 1935).*
Abstract of JP 60-035516 (dated Feb. 23, 1985).*

* cited by examiner

Primary Examiner—Alan A Mathews
(74) Attorney, Agent, or Firm—Staas & Halsey LLP

(57) ABSTRACT

An exposure process using photomasks, the process includes the steps of: providing a plurality of glass photomasks for optical lithography with respect to a target substrate to be processed, the photomasks having identical exposure patterns, and exposing the target substrate a plurality of times using the plurality of glass photomasks.

2 Claims, 9 Drawing Sheets

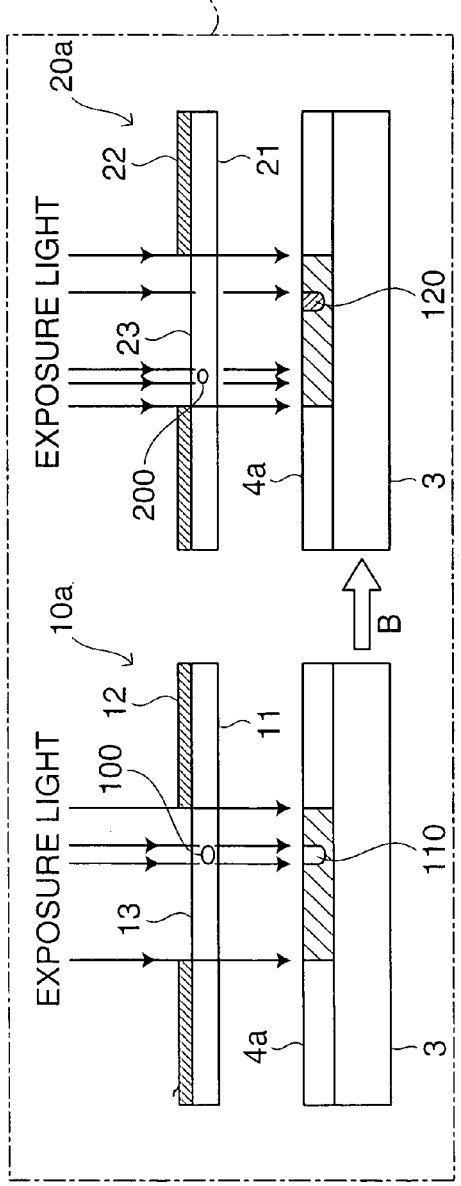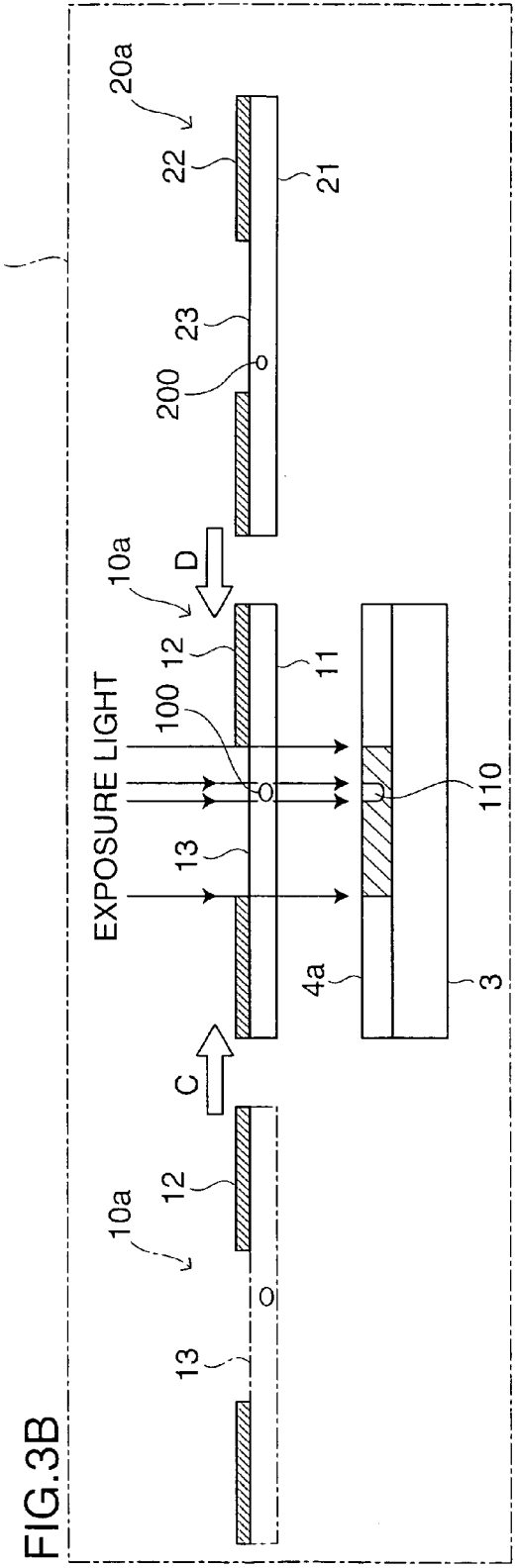

DEVELOPMENT

ETCHING

EXFOLIATION OF RESIST

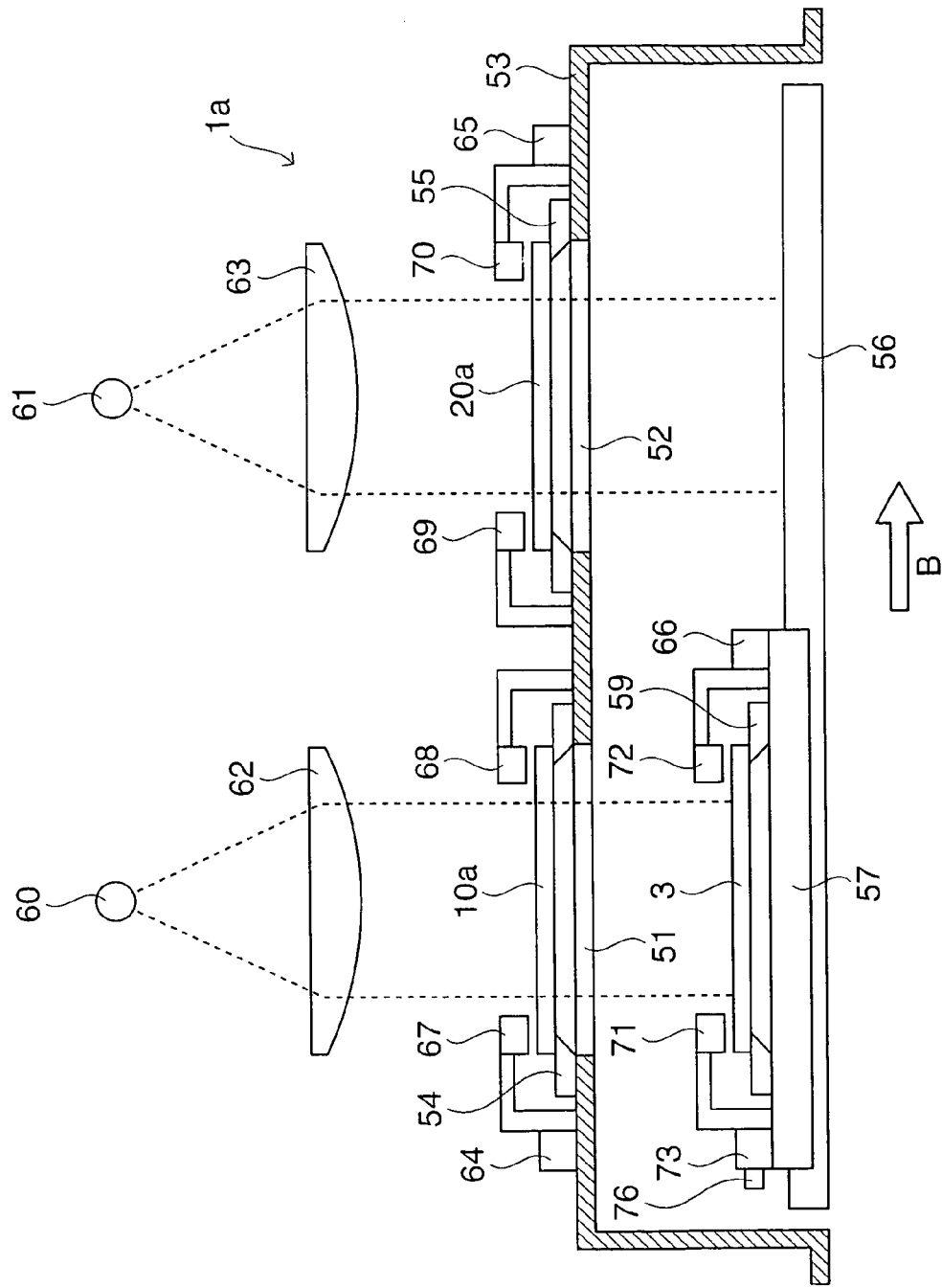

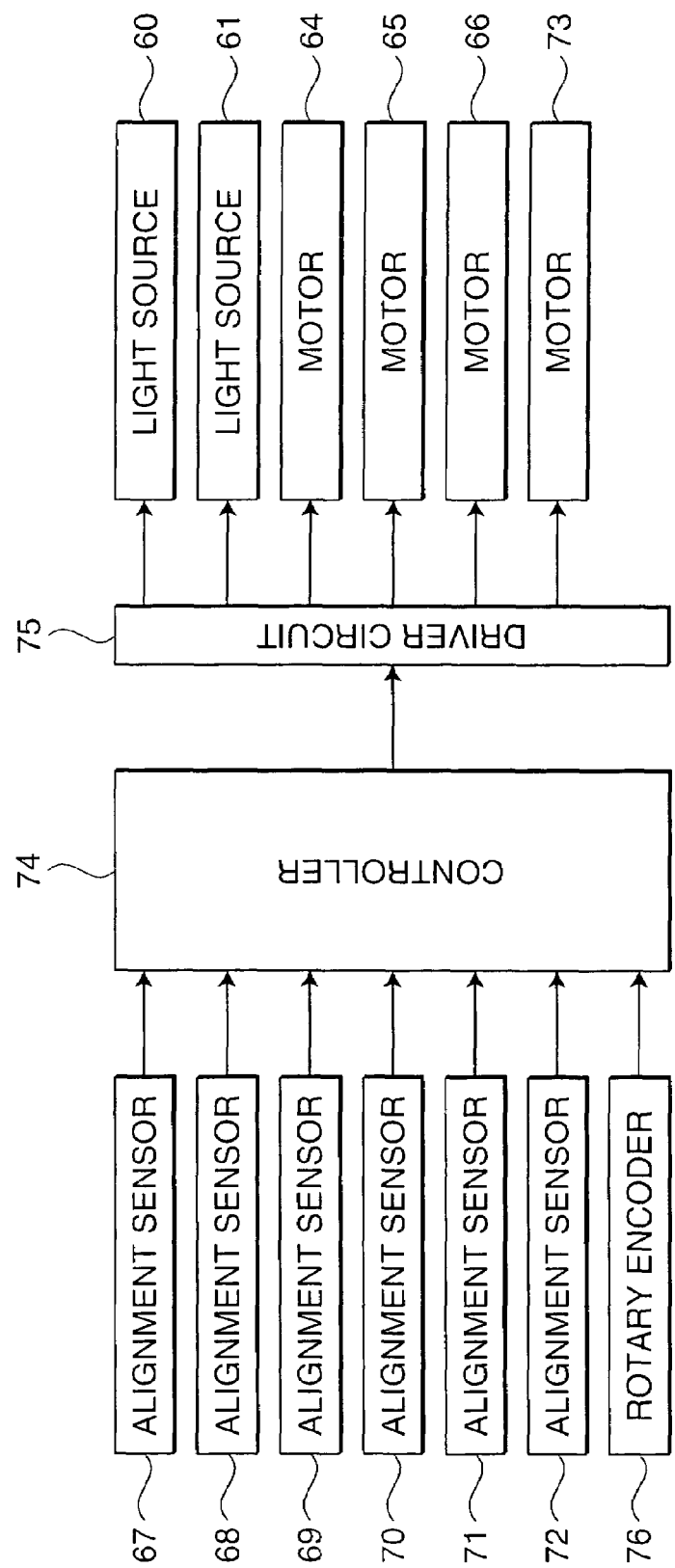

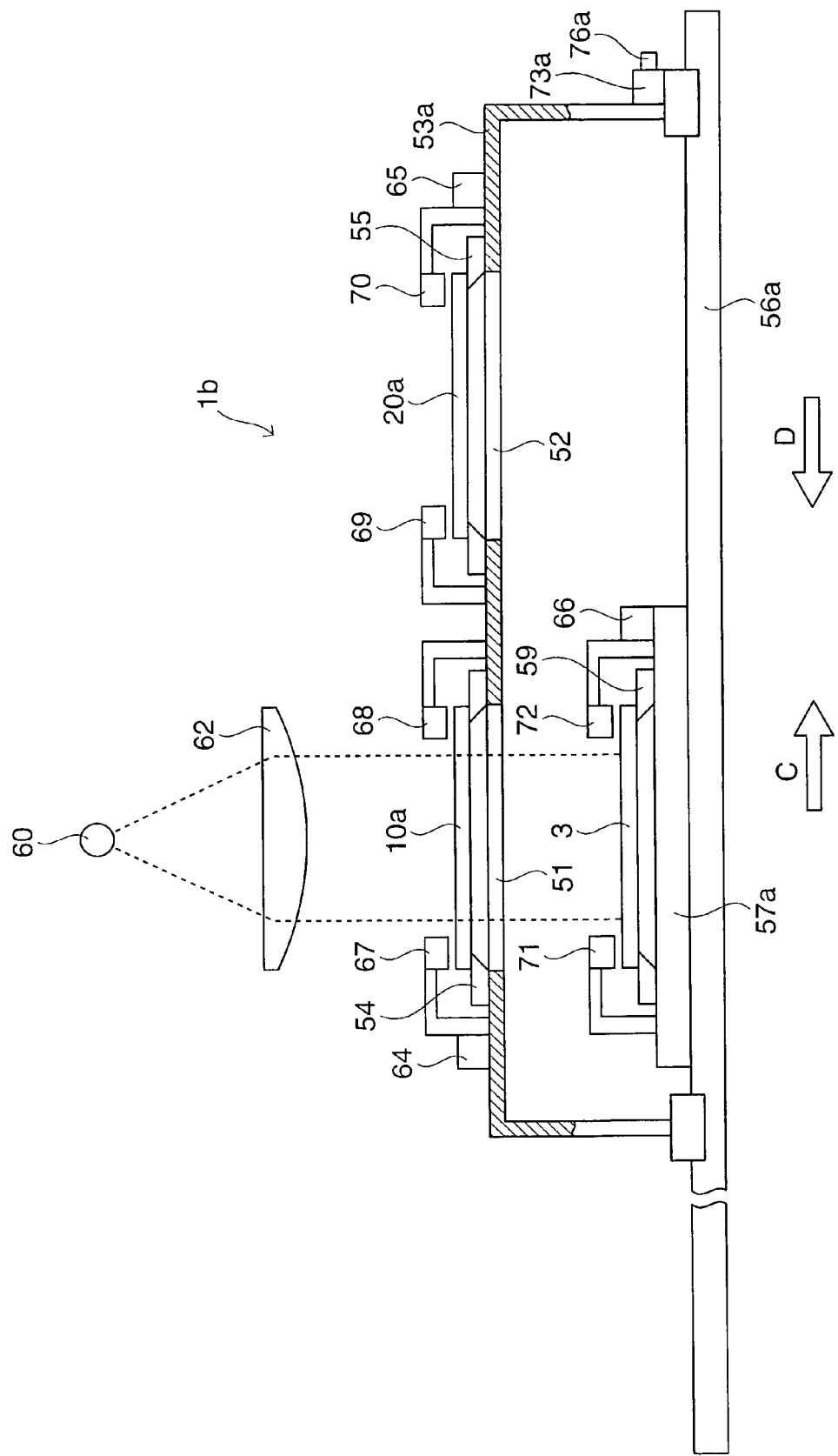

EXPOSURE PROCESS AND APPARATUS USING GLASS PHOTOMASKS

CROSS-REFERENCE TO RELATED APPLICATION

This application is related to Japanese Patent Application No. 2005-087588 filed on Mar. 25, 2005, whose priory is claimed and the disclosure of which is incorporated by reference in its entirety.

BACKGROUND OF THE INVENTION

1. Field of the Invention

The present invention relates to an exposure process and apparatus using glass photomasks which are used in the field of optical lithography.

2. Description of Related Art

As conventional exposure processes of a type using a photomask, those shown in FIGS. 4A-4E and FIGS. 5A-5E are known. FIGS. 4A-4E and FIGS. 5A-5E are explanatory views of exposure processes for exposing a negative resist and a positive resist, respectively, using glass photomasks.

According to the exposure process of FIGS. 4A-4E, a single glass photomask 10a is used in a single exposure apparatus. The photomask 10a includes a glass substrate 11 having an exposure pattern composed of a light-blocking area 12 and a light-transmitting area 13. A glass substrate 3 to be processed (target substrate) having a metal film 31 and a negative resist 4a stacked thereon is exposed to exposure light through the light-transmitting area 13 (FIG. 4A).

Then, the resist 4a is developed so that an unexposed area of the negative resist 4a is dissolved and removed (FIG. 4B).

Subsequently, the metal film 31 is etched so that the metal film 31 is removed except for an area under the unremoved resist 4a (FIG. 4C).

The resist 4a is then removed so that the metal film 31 of a desired pattern appears (FIG. 4D and FIG. 4E).

The exposure process of FIGS. 5A-5E uses a single glass photomask 10b in a single exposure apparatus. The glass photomask 10b includes a glass substrate 11 having an exposure pattern composed of a light-transmitting area 12 and a light-blocking area 13. A target glass substrate 3 having a metal film 31 and a positive resist 4b stacked thereon is exposed to exposure light through the light-transmitting area 13 (FIG. 5A).

Then, the resist 4b is developed so that an exposed area of the resist 4b is dissolved and removed (FIG. 5B).

Subsequently, the metal film 31 is etched so that the metal film 31 is removed except for an area under the unremoved resist 4b (FIG. 5C).

The resist 4b is then removed so that the metal film 31 of a desired pattern appears (FIG. 5D and FIG. 5E). Such processes as described above are disclosed in, for example, Japanese Unexamined Patent Publication No. HEI 4(1992)-109223.

Each of the glass photomasks 10a, 10b can be disposed in close contact with the target substrate or at a distance of several tens μm to several hundreds μm from the target substrate, or a pattern of the photomask can be projected onto the target substrate.

The conventional exposure processes using a glass photomask are carried out in the manner described above. Therefore, where there is a light-blocking defect 100 in the light-transmitting portion 13 in FIG. 4A, an unexposed area 110 is formed as shown in FIG. 4B and FIG. 4C. Further, where there is the light-blocking defect 100 in the light-transmitting portion 13 in FIG. 5A, an unexposed area 130 is formed as shown in FIG. 5B and FIG. 5C.

As a result, the metal film 31 having a defect 160 of missing a portion of the metal film as shown in FIG. 4D, FIG. 4E or a defect 150 of having a portion of the metal film remaining as shown in FIG. 5D and FIG. 5E is formed. In order to prevent such defects 150, 160, the photomasks 10a, 10b need to be fabricated so as to eliminate the defect 100, which results in a problem that the fabrication cost of the photomasks increases. In general, the glass photomasks have a structure in which a light-blocking pattern such as a chromium film is formed on a transparent glass substrate. The defects in the photomask 10a, 10b are caused by, for example, an air bubble or a damage in the substrate 11 as indicated by the defect 100, a crack in the light-blocking area 12 of the substrate 11, and adhesion of flying dust or the like during the fabrication process.

Particularly in plasma display panels with screens of increasing size, when the photomasks 10a, 10b are used for forming display electrodes (transparent electrodes, bus electrodes), address electrodes or barrier ribs, the substrate 11 would be defective even with only one air bubble in its large area. This results in problems that a defect-free substrate 11 increases the cost and a defective substrate 11 cannot be effectively used.

SUMMARY OF THE INVENTION

The present invention has been made in order to solve the above problems, and it provides an exposure process using glass photomasks which allows for reduction in fabrication cost of the photomasks and effective use of a defective glass substrate.

According to an aspect of the present invention, there is provided an exposure process using glass photomasks, the process comprising the steps of: providing a plurality of glass photomasks for optical lithography with respect to a target substrate to be processed, the photomasks having identical exposure patterns, and exposing the target substrate a plurality of times using the plurality of glass photomasks.

In the above-mentioned exposure process, each glass photomask may have a light-transmitting area and a light-blocking area defined by each exposure pattern, and at least one of the photomasks may have a defect that blocks light in the light-transmitting area.

Further, in the above-mentioned exposure process, the exposure patterns are preferably identical within a range of tolerance.

According to another aspect of the invention, provided is an exposure apparatus comprising: a supporter for supporting a plurality of glass photomasks for optical lithography; a mount for mounting a target substrate to be processed; a moving unit for moving the supporter and the mount relative to each other; a light source for exposing the substrate through one of the photomasks when the photomask faces the substrate; and a controller for controlling the moving unit and the light source, wherein the plurality of glass photomasks have identical exposure patterns and the target substrate is exposed a plurality of times using the plurality of glass photomasks.

The mount may be movable with respect to the supporter or the supporter may be movable with respect to the mount.

According to the present invention, the exposure is performed the plurality of times using the plurality of glass photomasks having the same pattern. Therefore, even when there is a defect that blocks light in at least one of the photomasks, formation of an unexposed area can be eliminated by multiple exposure. This allows for minimization of the fabrication cost and effective use of a defective glass substrate as well as prevention of exposure errors.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 3A and FIG. 3B are explanatory views of exposure processes using glass photomasks according to second and third embodiments of the invention, respectively;

FIG. 6 is an explanatory view illustrating a detailed structure of an exposure apparatus for performing the exposure process of FIG. 3A;

FIG. 7 is a block diagram of a control system of the apparatus of FIG. 6;

FIG. 8 is an explanatory view illustrating a detailed structure of an exposure apparatus for performing the exposure process of FIG. 3B.

DESCRIPTION OF THE PREFERRED EMBODIMENTS

First Embodiment

Figure 1:
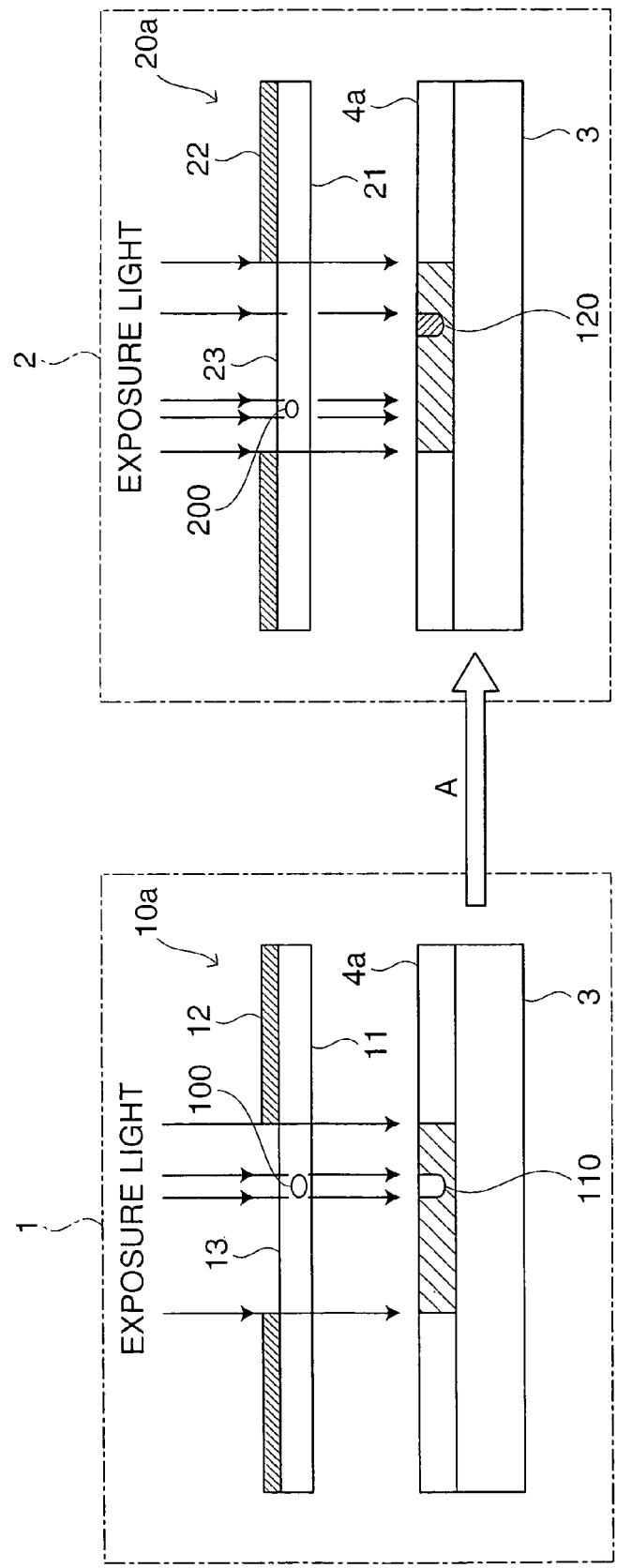
FIG. 1 is an explanatory view of an exposure process of a negative resist according to a first embodiment of the invention.
Figure 2:
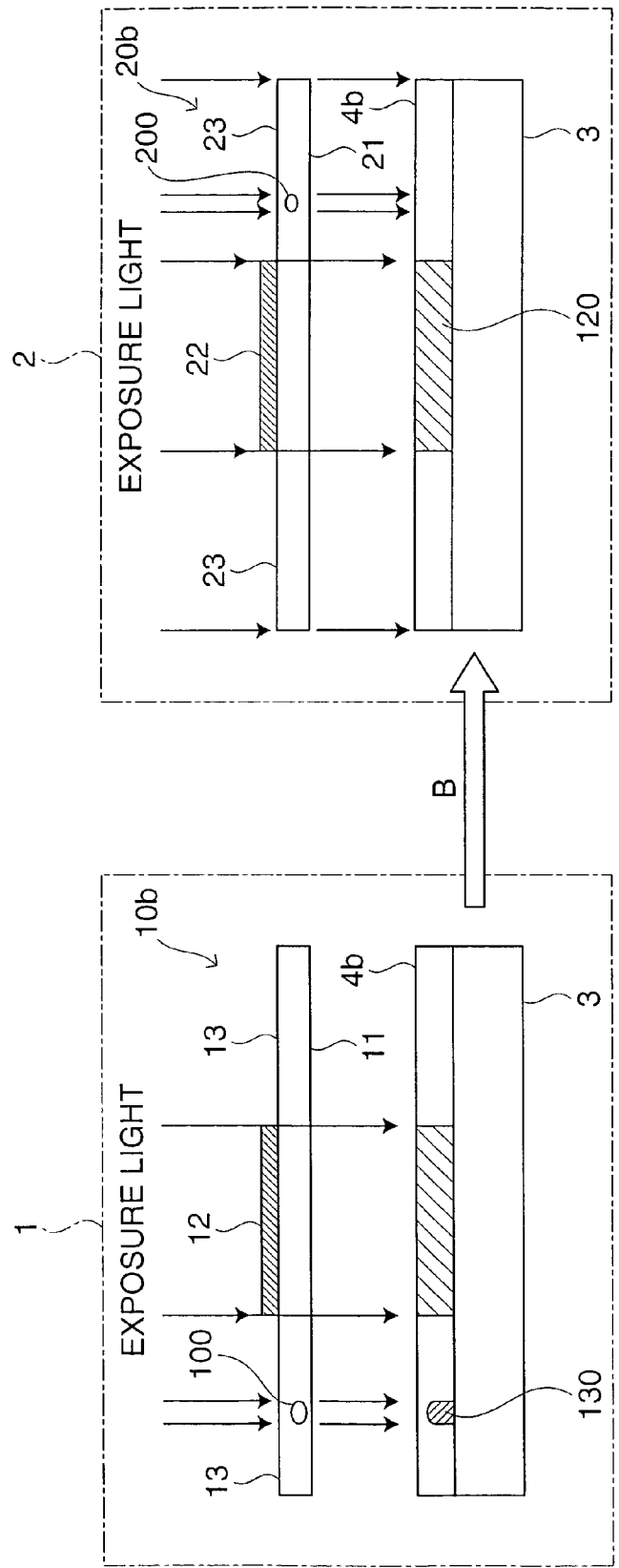
FIG. 2 is an explanatory view of an exposure process of a positive resist according to the first embodiment of the invention.
Figure 4A:
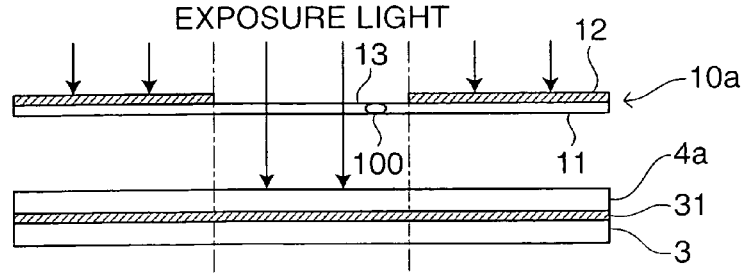
FIG. 4A to FIG. 4E are explanatory views of a conventional exposure process of a negative resist.
Figure 4B:
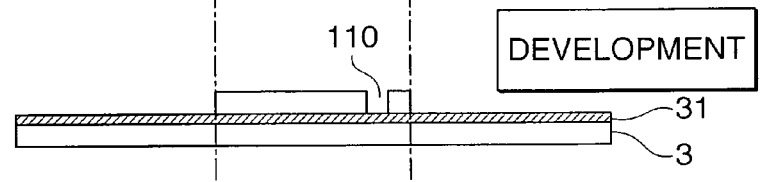
Figure 4C:
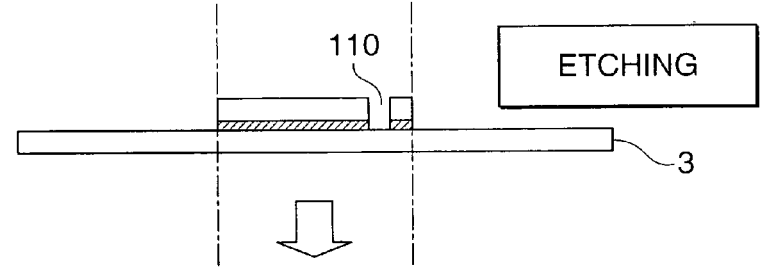
Figure 4D:
Figure 4E:
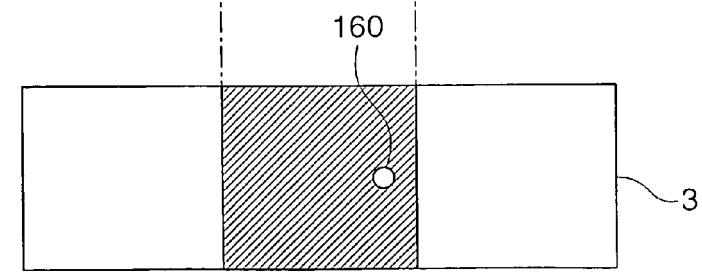
Figure 5A:
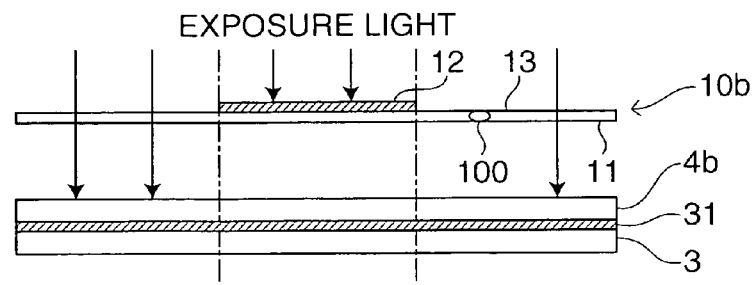
FIG. 5A to FIG. 5E are explanatory views of a conventional exposure process of a positive resist.
Figure 5B:
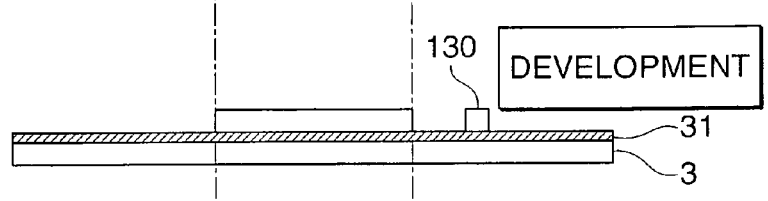
Figure 5C:
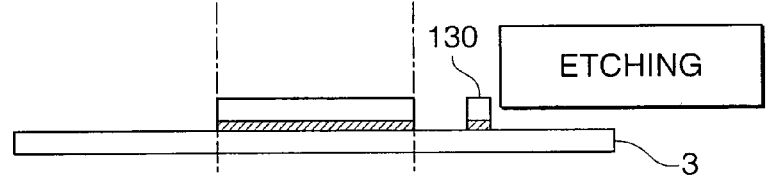
Figure 5D:
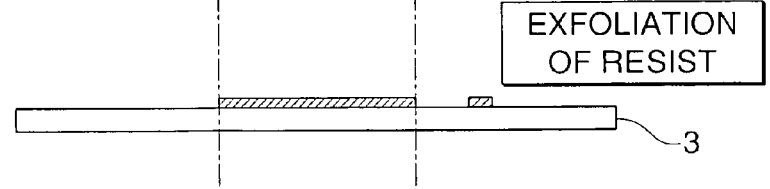
Figure 5E:
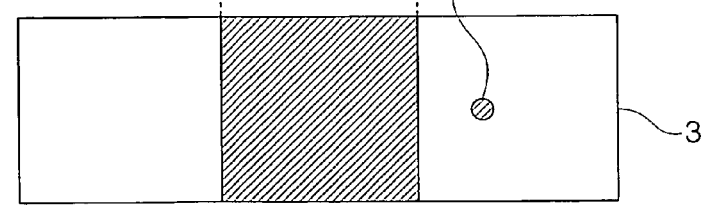

With reference to FIG. 1 and FIG. 2, an exposure system for performing an exposure process using glass photomasks according to a first embodiment of the invention will be described below. FIG. 1 is an explanatory view of an exposure process of a negative resist using glass photomasks, and FIG. 2 is an explanatory view of an exposure process of a positive resist using glass photomasks.

According to the exposure process of FIG. 1, a first exposure apparatus 1 and a second exposure apparatus 2 are arranged in parallel along a transfer direction (a direction of arrow A) of a substrate 3 to be processed (hereinafter referred to as a target substrate 3). The exposure apparatuses 1, 2 have glass photomasks 10a, 20a. The photomask 10a includes a glass substrate 11 having an exposure pattern composed of a light-blocking portion (light-blocking area) 12 and a light-transmitting portion (light-transmitting area) 13. The photomask 20a includes a glass substrate 21 having an exposure pattern composed of a light-blocking portion 22 and a light-transmitting portion 23. The photomasks 10a, 20a may be formed of, for example, a glass substrate having a light-blocking film corresponding to the exposure pattern formed on or under the substrate, or a glass substrate including therein a light-blocking material corresponding to the exposure pattern. The light-blocking portion (light-blocking film) may be a chromium film. The exposure pattern of the photomask 10a and the exposure pattern of the photomask 20a are identical within a range of tolerance. The target substrate 3 is subjected to a first exposure with the first exposure apparatus 1 and then a second exposure with the second exposure apparatus 2. It is supposed that the photomasks 10a, 20a have light-blocking defects 100, 200 in their light-transmitting portions, respectively, due to air bubbles.

In the exposure using the photomask 10a, a negative resist 4a on the target substrate 3 is irradiated with exposure light through the light-transmitting portion 13 of the mounted photomask 10a so that a portion of the resist (a hatched portion of the resist 4a in FIG. 1) is insolubilized to a developer. However, the defect 100 in the light-transmitting portion 13 blocks the exposure light, rendering a part of the resist 4a unexposed to light. Thus, an unexposed portion 110 is formed.

The target substrate 3 which includes the resist 4a having the unexposed portion 110 is moved in a direction of arrow A to the second exposure apparatus 2 and is exposed again using the exposure apparatus 2. The resist 4a is then irradiated with exposure light through the light-transmitting portion 23 of the photomask 20a mounted in the exposure apparatus 2. The light-transmitting portion 23 has the defect 200 caused by an air bubble as does the light-transmitting portion 13 of the photomask 10a. However, the defects 100, 200 are formed in different positions of their respective photomasks 10a, 20a, and there is almost no possibility that the defects 100, 200 are formed in the same position of the respective photomasks. Thus, the unexposed portion 110 can be exposed to exposure light through the light-transmitting portion 23 so that the unexposed portion 110 can be changed into an exposed portion 120 and be insolubilized.

As described above, even with the photomasks 10a, 20a formed of the glass substrates 11, 21 having the air-bubble defects 100, 200, respectively, a complete pattern of the resist 4a can be accurately formed by performing the exposure twice in such a manner that the photomasks 10a, 20a complement each other.

According to the exposure process of FIG. 2, which is contrary to the process of FIG. 1, a positive resist 4b is irradiated with exposure light through a light-transmitting portion 13 of a glass photomask 10b so that the resist is solubilized to a developer in a first exposure apparatus 1. However, the exposure light emitted through the light-transmitting portion 13 is blocked by an air bubble that forms a light-blocking defect 100 in the light-transmitting portion 13. This hinders a part of the resist 4b from being solubilized, and thereby an unexposed portion 130 is formed (see FIG. 2).

A target substrate 3 including the resist 4b having the unexposed portion 130 is moved in a direction of arrow B and placed inside a second exposure apparatus 2. The exposure apparatus 2 emits exposure light to the resist 4b including the unexposed portion 130 through a light-transmitting portion 23 of a photomask 20b so that the unexposed portion 130 is surely exposed. Thus, whole area of the resist 4b corresponding to the light-transmitting portion 23 can be solubilized to the developer.

According to the exposure process of FIG. 2 for the formation of a positive resist pattern, even when the photomasks 10b, 20b having the air-bubble defects is used as in the case of the negative resist, a complete pattern of the resist 4b can be accurately formed by performing the exposure twice in such a manner that the photomasks 10b, 20b complement each other.

Second Embodiment

In the first embodiment, the exposure is performed twice separately using two apparatuses, that is, the first and second exposure apparatuses 1, 2. Now, referring to FIG. 3A, an exposure process using glass photomasks according to a second embodiment of the invention is described. In this process, two light sources for emitting exposure light to two glass photomasks 10a, 20a, respectively, are provided in a single exposure apparatus 1a. In the exposure apparatus 1a, a target glass substrate 3 having a negative resist 4a formed thereon is transported in a direction of arrow B in FIG. 3A so as to sequentially receive exposure light emitted from the two light sources through the photomasks 10a, 20a, respectively. Thus, a complete pattern of the resist 4a can be accurately formed by performing the exposure twice in such a manner that the photomasks 10a, 20a complement each other as in the first embodiment.

Third Embodiment

According to the first and second embodiments, the target substrate 3 having the negative or positive resist 4a or 4b stacked thereon is moved relative to the photomasks 10a, 20a or 10b, 20b. However, in an exposure process using glass photomasks according to a third embodiment of the invention shown in FIG. 3B, a target glass substrate 3 having a negative resist 4a stacked thereon is fixed in a single exposure apparatus 1b, and glass photomasks 10a, 20a are moved in directions of arrow C and arrow D in FIG. 3B, respectively, to perform exposure.

Thus, according to the exposure process of the third embodiment, a complete pattern of the resist 4a can be accurately formed by performing the exposure twice in such a manner that the photomasks 10a, 20a, one or both of which have a defect, complement each other as in the previous embodiments.

FIG. 6 is an explanatory view illustrating a detailed structure of the exposure apparatus 1a of FIG. 3A. In FIG. 6, the apparatus 1a includes a support table 53 having openings 51, 52. The support table 53 has stages 54, 55 disposed on the peripheries of the openings 51, 52, respectively. The stages 54, 55 are two-dimensionally movable and slightly rotatable in a horizontal plane and are adapted to horizontally support the photomasks 10a, 20a, respectively. Below the support table 53, a sliding rail 56 is horizontally placed. The sliding rail 56 slidably supports a slider 57 in a direction of arrow B or in an opposite direction. The slider 57 has a stage 59 disposed thereon. The stage 59 is two-dimensionally movable and slightly rotatable in a horizontal plane and is adapted to horizontally support the target substrate 3. Above the support table 53, two light sources 60, 61 for emitting exposure light and collimator lens 62, 63 for collimating light emitted from the light sources 60, 61, respectively, are provided. The light sources 60, 61 are adapted to vertically illuminate, through the lens 62, 63, the photomasks 10a, 20a with light emitted from the light sources 60, 61, respectively. The resist 4a on the target glass substrate 3 (see FIG. 3A) is then exposed to the light transmitted through the photomask 10a or 20a. The support table 53 is equipped with motors 64, 65 for driving the stages 54, 55, respectively, and the slider 57 is equipped with a motor 66 for driving the stage 59.

The support table 53 includes alignment sensors 67, 68 for detecting alignment marks of the photomask 10a at positions opposed to the periphery of the photomask 10a. The support table 53 also includes alignment sensors 69, 70 for detecting alignment marks of the photomask 20a at positions opposed to the periphery of the photomask 20a. The slider includes alignment sensors 71, 72 for detecting alignment marks of the target glass substrate 3 at positions opposed to the periphery of the substrate 3. Further, on the slider 57, a motor 73 for driving the slider 57 is provided. The motor 73 is equipped with a rotary encoder 76 which detects the position of the slider 57 on the sliding rail 56.

FIG. 7 is a block diagram illustrating a control system of the exposure apparatus 1a of FIG. 6. In FIG. 7, a controller 74 receives outputs from the sensors 67-72 and the rotary encoder 76 of the motor 73 to control a driver circuit 75. The driver circuit 75 drives the light sources 60, 61 and the motors 64-66, 73. The controller 74 includes a microcomputer composed of a CPU, ROM and RAM, and the driver circuit 75 includes a power circuit for lighting the light sources and a power circuit for driving the motors.

In the exposure apparatus 1a of FIG. 6 and FIG. 7, when the photomasks 10a, 20a are mounted on the stages 54, 55, respectively, the alignment marks of the photomasks 10a, 20a are detected by the alignment sensors 67, 68 and 69, 70, respectively. Then, the stages 54, 55 are driven to align each of the photomasks 10a, 20a at a predetermined position.

Subsequently, when the target glass substrate 3 is mounted on the stage 59, the alignment marks of the substrate 3 are detected by the alignment sensors 71, 72. The stage 59 is then driven to align the substrate 3 at a predetermined position. On the other hand, the position of the slider 57 on the sliding rail 56 is detected by the rotary encoder 76 and the slider 57 is driven to be aligned at a predetermined position shown in FIG. 6.

Next, the light source 60 is lit for a predetermined period of time and the substrate 3 is exposed to light through the photomask 10a.

The slider 57 is then moved in the direction of arrow B. When the slider 57 reaches a predetermined position below the photomask 20a, the light source 61 is lit for a predetermined period of time so that the substrate 3 is subjected to a second exposure through the photomask 20a.

FIG. 8 is an explanatory view illustrating a detailed structure of the exposure apparatus 1b of FIG. 3B. In FIG. 8, the exposure apparatus 1b includes a sliding table 53a having openings 51, 52. The sliding table 53a has stages 54, 55 disposed on the peripheries of the openings 51, 52, respectively. The stages 54, 55 are two-dimensionally movable and slightly rotatable in a horizontal plane.

The stages 54, 55 are adapted to horizontally support the photomasks 10a, 20a, resepctively. Below the sliding table 53a, a sliding rail 56a is placed. The sliding rail 56a slidably supports the sliding table 53a in directions of arrow C and arrow D. A mount 57a provided below the sliding table 53a includes a stage 59 which is two-dimensionally movable and slightly rotatable in a horizontal plane. The stage 59 is adapted to horizontally support the target substrate 3.

Above the sliding table 53a, a light source 60 for emitting exposure light and a collimator lens 62 for collimating light from the light source 60 are disposed. The light source 60 is adapted to vertically illuminate, through the lens 62, the photomask 10a or 20a with light emitted from the light source 60.

The resist 4a on the target glass substrate 3 (see FIG. 3B) is sequentially exposed to light that is transmitted through the photomasks 10a and 20a. The sliding table 53a includes motors 64, 65 for driving the stages 54, 55, respectively, and the mount 57a includes a motor 66 for driving the stage 59.

The table 53a also includes alignment sensors 67, 68 for detecting alignment marks of the photomask 10a at positions opposed to the periphery of the photomask 10a. Similarly, the sliding table 53a includes alignment sensors 69, 70 for detecting alignment marks of the photomask 20a at positions opposed to the periphery of the photomask 20a.

The mount 57a includes alignment sensors 71, 72 for detecting alignment marks of the target substrate 3 at positions opposed to the periphery of the substrate 3.

Further, the sliding table 53a includes a motor 73 for driving the sliding table 53a. The motor 73 is equipped with a rotary encoder 76a which detects the position of the sliding table 53a on the sliding rail 56a.

Figure 9:
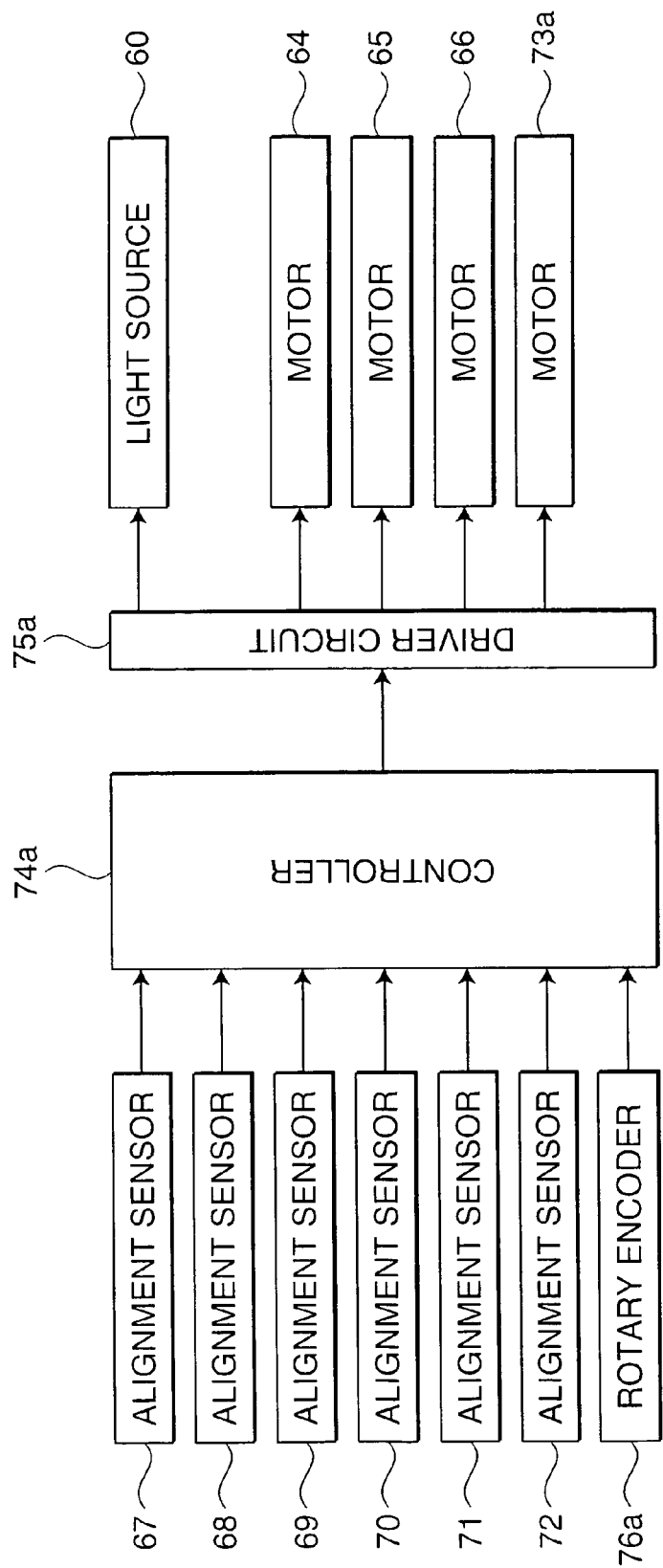
FIG. 9 is a block diagram of a control system of the apparatus of FIG. 8.

FIG. 9 is a block diagram illustrating a control system of the exposure apparatus 1b of FIG. 8. In FIG. 9, a controller 74a receives outputs from the alignment sensors 67-72 and the rotary encoder 76a of the motor 73a to control a driver circuit 75a. The driver circuit 75a drives the light source 60 and the motors 64-66, 73a. The controller 74a includes a microcomputer composed of a CPU, ROM and RAM, and the driver circuit 75a includes a power circuit for lighting the light source and a power circuit for driving the motors.

In the exposure apparatus 1b of FIG. 8 and FIG. 9, when the photomasks 10a, 20a are mounted on the stages 54, 55, respectively, the alignment marks of the photomasks 10a, 20a are detected by the alignment sensors 67, 68 and 69, 70, respectively.

Then, the stages 54, 55 are driven to align each of the photomasks 10a, 20a at a predetermined position.

Subsequently, when the target glass substrate 3 is mounted on the stage 59, the alignment marks of the substrate 3 are detected by the alignment sensors 71, 72.

The stage 59 is then driven to align the substrate 3 at a predetermined position. On the other hand, the position of the table 53a on the sliding rail 56a is detected by the rotary encoder 76a, and the sliding table 53a is driven to be aligned at a predetermined position shown in FIG. 8.

Next, the light source 60 is lit for a predetermined period of time so that the substrate 3 is exposed through the photomask 10a.

The sliding table 53a is moved in the direction of arrow D. When the photomask 20a reaches a predetermined position above the substrate 3, the light source 60 is lit for a predetermined period of time so that the substrate 3 is subjected to a second exposure through the photomask 20a.

According to the third embodiment of the invention, the resist 4a on the target substrate 3 is thus exposed.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming electrode patterns on a large area type of glass substrate using photolithography, the method comprising:

providing a first exposure apparatus and a second exposure apparatus;

loading a first defective photomask and a second defective photomask into the first exposure apparatus and the second exposure apparatus, respectively, the first defective photomask and the second defective photomask each having a same mask pattern corresponding to an electrode pattern to be formed and each including a large area type glass mask plate corresponding to the glass substrate, each of the large area type glass mask plates having a light-blocking portion and a light-transmitting portion, each light-transmitting portion including an air bubble forming a light-block defect;

loading the glass substrate into the first exposure apparatus and performing a first exposure on the glass substrate through the first defective photomask; and loading the glass substrate into the second exposure apparatus and performing a second exposure on the glass substrate through the second defective photomask.

2. The method according to claim 1, wherein the loading the glass substrate into the second exposure apparatus is carried out by transporting the glass substrate along a sliding rail between the first exposure apparatus and the second exposure apparatus after the first exposure apparatus has performed the first exposure.

\* \* \* \* \*

UNITED STATES PATENT AND TRADEMARK OFFICE
CERTIFICATE OF CORRECTION

PATENT NO. : 7,538,853 B2 Page 1 of 1
APPLICATION NO. : 11/384317
DATED : May 26, 2009
INVENTOR(S) : Masashi Nishiki et al.

It is certified that error appears in the above-identified patent and that said Letters Patent is hereby corrected as shown below:

Title Page, Column 2 under item [56] (Other Publications), Line 1, change "1935).*" to --1985).*--.

Column 1, Line 8, change "priory" to --priority--.

Signed and Sealed this

Sixth Day of October, 2009

David J. Kappos
*Director of the United States Patent and Trademark Office*